United States Patent
Shimoida et al.

(10) Patent No.: US 7,695,997 B2
(45) Date of Patent: Apr. 13, 2010

(54) SEMICONDUCTOR DEVICE AND MANUFACTURING METHOD THEREOF

(75) Inventors: Yoshio Shimoida, Yokosuka (JP); Masakatsu Hoshi, Yokohama (JP); Tetsuya Hayashi, Yokosuka (JP); Hideaki Tanaka, Yokohama (JP); Shigeharu Yamagami, Yokohama (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 241 days.

(21) Appl. No.: 11/790,792

(22) Filed: Apr. 27, 2007

(65) Prior Publication Data

US 2007/0252168 A1    Nov. 1, 2007

(30) Foreign Application Priority Data

Apr. 28, 2006    (JP)    .............................. 2006-125422

(51) Int. Cl.
  *H01L 21/00*    (2006.01)
  *H01L 31/072*    (2006.01)
(52) U.S. Cl. ........................................ 438/91; 257/199
(58) Field of Classification Search ................. 257/328, 257/363, 350, 355, 199, 360, 379, 380, 183, 257/196, E29.18, E29.334, E21.354–E21.357; 438/91, 199, 380, 983
  See application file for complete search history.

(56) References Cited

U.S. PATENT DOCUMENTS

| | | | |
|---|---|---|---|
| 5,139,959 A | | 8/1992 | Craft et al. |
| 5,475,258 A | * | 12/1995 | Kato et al. .................. 257/603 |
| 5,567,968 A | * | 10/1996 | Tsuruta et al. .............. 257/356 |
| 5,982,021 A | | 11/1999 | Verma |
| 7,402,871 B2 | * | 7/2008 | Song ........................... 257/379 |
| 2002/0050602 A1 | | 5/2002 | Narazaki |
| 2002/0113293 A1 | | 8/2002 | Robb et al. |
| 2003/0042538 A1 | * | 3/2003 | Kumar et al. ................ 257/328 |

FOREIGN PATENT DOCUMENTS

| | | |
|---|---|---|
| EP | 0224274 A2 | 6/1987 |
| EP | 1641030 A2 | 3/2006 |
| JP | 6-342915 A | 12/1994 |
| WO | WO 03/079452 A1 | 9/2003 |

* cited by examiner

*Primary Examiner*—Calvin Lee
(74) *Attorney, Agent, or Firm*—Foley & Lardner LLP

(57) ABSTRACT

An electrostatic discharge protection element and a protection resistor, which are formed on an N− drain region with a field oxide film interposed therebetween for the purpose of preventing electrical breakdown of a field effect transistor, are composed as a stacked bidirectional Zener diode of one or a plurality of N+ polycrystalline silicon regions of a first layer and a P+ polycrystalline silicon region of a second layer, and a stacked resistor of one or a plurality of N+ resistor layers of the first layer and an N+ resistor layer of the second layer, respectively. One end of the plurality of N+ polycrystalline silicon regions of the first layer is connected to an external gate electrode terminal, and the other end is connected to a source electrode. One end of the plurality of N+ resistor layers of the first layer is connected to a gate electrode, and the other end is connected to the external gate electrode terminal. Semiconductor regions of the first layer and the second layer are formed by using semiconductor films, which form a hetero semiconductor region and the gate electrode, respectively.

33 Claims, 9 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof.

2. Description of the Related Art

As a conventional technology serving as a background of the present invention, there is a semiconductor device described in Japanese Patent Laid-Open Publication No. H6-342915 "MOS Type Power Semiconductor Device Including Protection Element and Manufacturing Method Thereof" shown in Patent Document 1. The semiconductor device described in Patent Document 1 includes not only a mechanism for discharging static electricity applied to an external gate electrode terminal exposed to the outside but also a resistor having a large sheet resistance, which is for use in protecting a gate electrode from the static electricity, in a gate electrode terminal, thus making it possible to effectively prevent a breakage of a gate insulating film owing to the static electricity.

Specifically, in Patent Document 1, when an object charged with the static electricity, such as a human body, is brought into contact with the external gate electrode terminal of the semiconductor device, the static electricity is discharged from the external gate electrode terminal to a source electrode at a ground potential through a bidirectional Zener diode provided as the mechanism for discharging the static electricity, that is, as such an electrostatic discharge protection element while bypassing the gate electrode. Meanwhile, a part of the static electricity applied to the external gate electrode terminal enters the gate electrode through the resistor for the protection from the static electricity, and is then diffused into the inside of the gate electrode. However, in the conventional technology described in Patent Document 1, a sheet resistance of a semiconductor thin film that forms the resistor is made larger than a sheet resistance of a semiconductor thin film that forms the gate electrode. In such a way, the static electricity that has entered the gate electrode is diffused rapidly into the gate electrode to reduce a density of the static electricity, a high electric field is prevented from being applied to the gate insulating film, and the breakage of the gate insulating film is prevented.

SUMMARY OF THE INVENTION

In general, in order to enhance a tolerance of the semiconductor device for the static electricity, it is necessary to sufficiently increase a junction area of the bidirectional Zener diode that functions as the electrostatic discharge protection element, and to sufficiently reduce an internal resistance of the electrostatic discharge protection element after a breakdown thereof. Moreover, it is necessary that the resistor for the protection from the entrance of the static electricity be provided with a degree of freedom where a resistance value can be set at a desired large value for obtaining such an electrostatic tolerance of the semiconductor device.

In the above-described conventional technology of Patent Document 1, the target semiconductor device is a power MOS type field effect transistor. Moreover, by using a single polycrystalline silicon (poly-Si) layer, the bidirectional Zener diode as the electrostatic discharge protection element and the protection resistor for the protection from the entrance of the static electricity (that is, for protecting the gate electrode) are formed. Hence, the bidirectional Zener diode is composed by forming PN junctions in such a manner that the respective side surfaces of an N+ poly-Si layer, a P+ poly-Si layer, and an N+ poly-Si layer, which are formed in the same layer of the single layer concerned, are brought into contact with one another. Therefore, a height that determines the junction area of junction portions of the bidirectional Zener diode is regulated by a thickness of the single polycrystalline silicon (poly-Si) layer.

Moreover, in general, in terms of a layout of a chip plane of the semiconductor device, an almost entire region of the chip plane is usually covered with a source cell region connected to the ground, and an external gate electrode terminal region (that is, a gate bonding pad (GP) region) exposed to the outside and connected to the gate electrode is very little. Accordingly, it is necessary to form the bidirectional Zener diode of the electrostatic discharge protection element in an extremely small area around the external gate electrode terminal region. Hence, it is necessary to ensure a width that determines the junction area of the junction portions of the bidirectional Zener diode to a sufficiently large extent. Therefore, there has been a problem that it is difficult to sufficiently increase the junction area of the bidirectional Zener diode, to sufficiently reduce the internal resistance of the electrostatic discharge protection element after the breakdown thereof, and to thereby obtain a sufficient electrostatic tolerance of the semiconductor device.

Meanwhile, the resistance value of such an electrostatic entrance protection resistor formed of the polycrystalline silicon is also regulated only by the single layer of the polycrystalline silicon, and accordingly, there has been a problem that a sufficiently large resistance value cannot be obtained, which enables the sheet resistance of the resistor to be sufficiently larger than the sheet resistance of the gate electrode and enables the static electricity in the gate electrode to be diffused rapidly at a desired speed.

The present invention has been made in consideration for the problems as described above. It is an object of the present invention to provide a semiconductor device as a heterojunction field effect transistor, in which it is made possible, without bringing a large increase of manufacturing steps, to sufficiently increase the junction area of the bidirectional Zener diode of the electrostatic discharge protection element as an electrostatic protection passive element, and further to sufficiently increase the resistance value of the protection resistor for the protection from the entrance of the static electricity to the gate electrode (for protecting the gate electrode), and the tolerance for the static electricity is thereby made large. The object of the present invention is also to provide a manufacturing method of the above-described semiconductor device.

In order to solve the above-described problems, the present invention is characterized in that the electrostatic protection passive element for the heterojunction transistor is formed by overlapping two layers of semiconductor regions with each other.

According to the semiconductor device of the present invention, the configuration is adopted, in which the electrostatic protection passive element for the heterojunction transistor is formed by overlapping the two layers of semiconductor regions with each other. Accordingly, the electrostatic protection passive element can be formed into a mode in which a sufficient tolerance for the static electricity is obtained even in such a restricted narrow region on the chip plane. For example, the junction area of the bidirectional Zener diode that composes the electrostatic protection passive element can be made sufficiently large, and accordingly, the internal resistance of the electrostatic discharge element concerned after the breakdown thereof can be made sufficiently small. Then, an effect is obtained that a semiconductor device having a large tolerance for the static electricity can be provided.

BRIEF DESCRIPTION OF THE DRAWINGS

Exemplary embodiments of the invention will become more fully apparent from the following description and appended claims, taken in conjunction with the accompanying drawings. Understanding that these drawings depict only exemplary embodiments and are, therefore, not to be considered limiting of the invention's scope, the exemplary embodiments of the invention will be described with additional specificity and detail through use of the accompanying drawings in which:

DETAILED DESCRIPTION OF THE PREFERRED EMBODIMENTS

Figure 1:
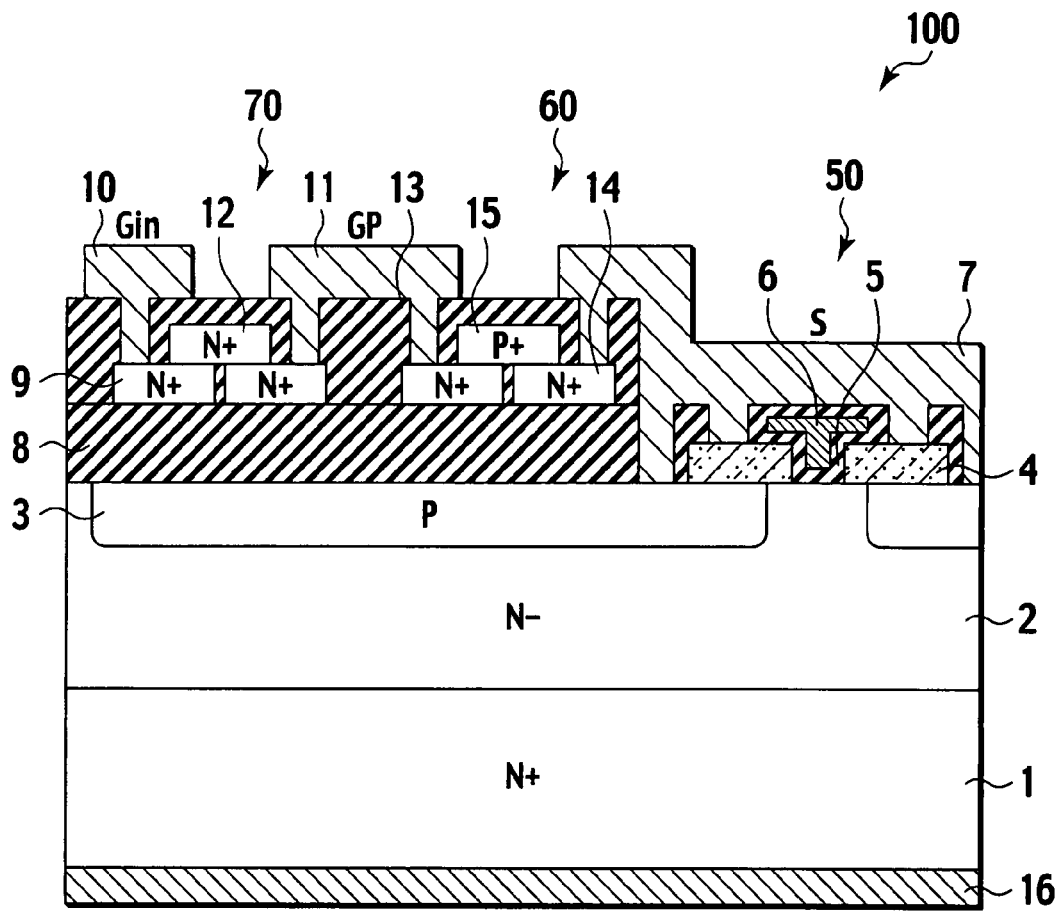
FIG. 1 is a cross-sectional view schematically showing a structure of a device cross section of a field effect transistor in a first embodiment of a semiconductor device according to the present invention.

A description will be made below in detail of best embodiments of a semiconductor device and a manufacturing method thereof according to the present invention while referring to the drawings.

First Embodiment

A description will be made of a configuration of a semiconductor device in a first embodiment of the present invention by using FIG. 1. FIG. 1 is a cross-sectional view schematically showing a structure of a device cross section of a field effect transistor in the first embodiment of the semiconductor device according to the present invention.

Configuration Example

In a semiconductor device 100 of FIG. 1, a right-side portion of the drawing shows a unit cell of a heterojunction field effect transistor 50. Although a plurality of the unit cells actually form the transistor by being parallelly connected, a description will be made of the transistor concerned by using this cross-sectional structure as a representative. Moreover, a left-side portion of the drawing shows a configuration of an electrostatic discharge protection element 60 and a protection resistor 70, which are formed as an electrostatic protection passive element on a field oxide film 8, that is, on a field insulating film.

First, a description will be made of a planar layout of the electrostatic discharge protection element 60 and the protection resistor 70 in the heterojunction field effect transistor 50 that composes the semiconductor device 100 of FIG. 1.

Figure 17:
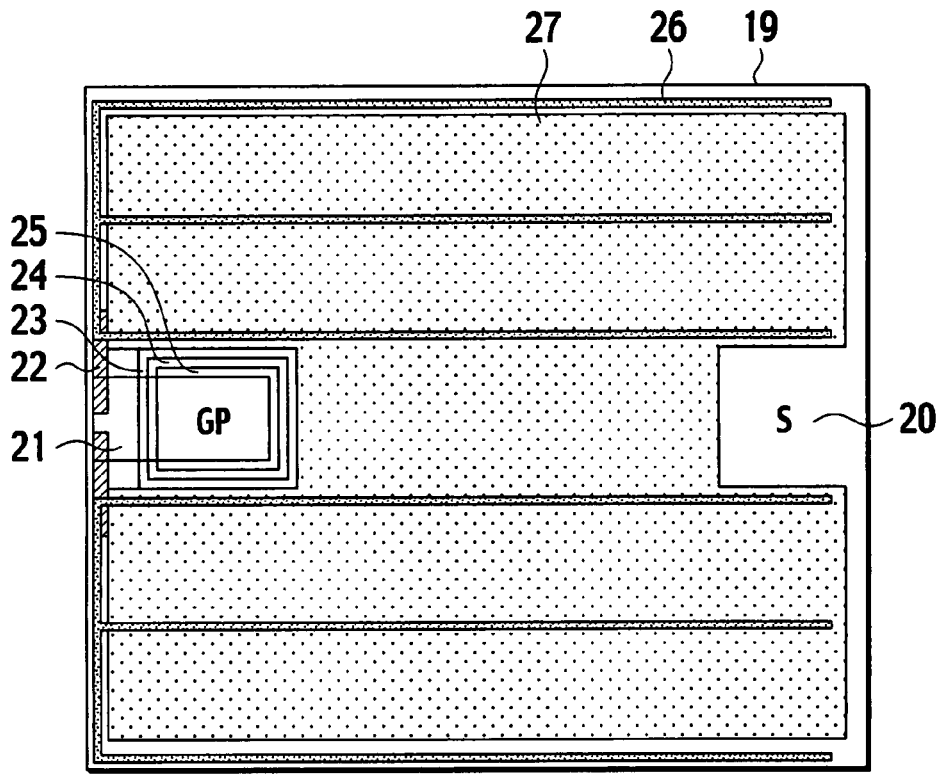
FIG. 17 is a chip plane layout view showing a chip plane of a field effect transistor in a conventional technology.

A region of a plane of a semiconductor chip of the heterojunction field effect transistor 50, which is occupied by a bidirectional Zener diode that composes the electrostatic discharge protection element 60 and by the protection resistor 70 for protection from entrance of static electricity (for protecting a gate electrode), is similar to the case of a field effect transistor in the conventional technology. For example, as shown in a plane layout view of a semiconductor chip of the conventional technology in FIG. 17, the region if formed around an external gate electrode terminal region (a gate bonding pad (GP) region) 21 including an external gate electrode terminal exposed to the outside. FIG. 17 is the chip plane layout view showing a chip plane of the field effect transistor in the conventional technology. Also in the first embodiment of the present invention, as a similar arrangement to the above, the bidirectional Zener diode of the electrostatic discharge protection element 60 and such an electrostatic entrance protection resistor 70 are arranged in the narrow region around the external gate electrode terminal region (the gate bonding pad (GP) region) 21.

Specifically, as shown in FIG. 17, an almost entire region of the plane of the field effect transistor chip 19 is covered with a source cell region 27, and it is necessary to form the bidirectional Zener diode of the electrostatic discharge protection element and the protection resistor for the protection from the entrance of the static electricity in an extremely small area around the external gate electrode terminal region (the gate bonding pad (GP) region) 21 exposed to the outside for connecting to a gate electrode. Specifically, a configuration is formed, in which an N+ poly-Si region 23, a P+ poly-Si region 24, and an N+ poly-Si region 25, which compose the bidirectional Zener diode, and a protection resistor 22 for the protection from the entrance of the static electricity are formed in the narrow region around the external gate electrode terminal region 21. In this case, the N+ poly-Si region 23, the P+ poly-Si region 24, and the N+ poly-Si region 25 correspond to N+ polycrystalline silicon regions 14 of a first layer and a P+ polycrystalline silicon region 15 of a second layer, which compose the electrostatic discharge protection element 60 of FIG. 1. Moreover, the protection resistor 22 corresponds to N+ resistor layers 9 of the first layer and an N+ resistor layer 12 of the second layer, which compose the protection resistor 70 of FIG. 1.

Here, the N+ poly-Si region 23 serving as a one-side terminal of the bidirectional Zener diode of the electrostatic discharge protection element is connected to the gate electrode via a gate runner 26 through the protection resistor 22. Meanwhile, the N+ poly-Si region 25 serving as the other-side terminal of the bidirectional Zener diode is connected to a source electrode terminal region (a source pad region) 20.

Next, a description will be made of a structure of a device cross section of the semiconductor device 100 of FIG. 1.

In the structure of the device cross section of the semiconductor device 100 of FIG. 1, on a first main surface of an N-type high-concentration (N+) SiC substrate region 1 using, for example, silicon carbide (SiC) as a semiconductor material, an N-type low-concentration (N−) SiC drain region 2 is formed, and forms a semiconductor base. This N− SiC drain region 2 as the semiconductor base is composed of an epitaxial layer grown on the N+ SiC substrate region 1. As SiC that forms the semiconductor base, some polytypes (polycrystalline forms) are present. Here, four-layer hexagonal silicon carbide (4H-SiC) that is representative is used. In FIG. 1, a concept of thicknesses of the N+ SiC substrate region 1 and the N− SiC drain region 2 is omitted. Actually, the N+ SiC substrate region 1 has a thickness of several hundred micrometers, and the N− SiC drain region 2 has a thickness from several micrometers to ten and several micrometers.

On a desired position in an inside of a first main surface of the N− SiC drain region 2, a P well region 3 is formed as a field limiting layer for limiting an electric field of a drain electrode 16 to the first main surface side of the N− SiC drain region 2.

Moreover, as shown in a cross-sectional structure of the field effect transistor 50 of the right-side portion in FIG. 1, on a desired position on the first main surface of the N− SiC drain region 2, a hetero semiconductor region 4 made of, for example, polycrystalline silicon as a semiconductor material is formed. The SiC of the N− SiC drain region 2 and the polycrystalline silicon of the hetero semiconductor region 4 are different from each other in band gap and also in electron affinity. Hence, on a junction interface between the N− SiC drain region 2 and the hetero semiconductor region 4, a heterojunction is formed.

Moreover, on a position close to apart of the junction portion of the N− SiC drain region 2 and the hetero semiconductor region 4, a gate electrode 6 is formed with a gate insulating film 5 interposed therebetween. The hetero semiconductor region 4 is ohmically connected directly to a source electrode 7. Meanwhile, the drain electrode 16 is ohmically connected with an electrically low resistance to a back surface of the N+ SiC substrate region 1.

Here, in the semiconductor device 100 of FIG. 1, as a unique device structure of the present invention, which forms the electrostatic protection passive element for the field effect transistor 50 in the right-side portion of FIG. 1, a structure of a stacked passive element is used on the field oxide film 8 thicker than the gate insulating film 5 as shown in the configuration of the electrostatic discharge protection element 60 and the protection resistor 70 in the left-side portion of FIG. 1. Specifically, the stacked passive element is composed of one or a plurality of semiconductor regions of the first layer, for example, polycrystalline silicon regions and of one or a plurality of semiconductor regions of the second layer, for example, polycrystalline silicon regions, has contact regions where the semiconductor regions of the first layer and the semiconductor regions of the second layer are vertically overlapped and brought into contact with each other, and is thereby composed of the electrostatic discharge protection element 60 and the protection resistor 70.

Moreover, polycrystalline silicon layers of the electrostatic discharge protection element 60 and the protection resistor 70 in the first layer are formed in a state where polycrystalline silicon layers of semiconductor films deposited as the heterojunction field effect transistor 50 on the right-side portion of FIG. 1 for the purpose of forming the hetero semiconductor region 4 are individually divided into a plurality of island regions predetermined as polycrystalline silicon regions 9 and 14 of the first layer, and the divided polycrystalline silicon regions 9 and 14 are electrically insulated from each other. Moreover, polycrystalline silicon layers of the electrostatic discharge protection element 60 and the protection resistor 70 in the second layer are formed so that polycrystalline silicon layers of semiconductor films deposited as the heterojunction field effect transistor 50 on the right-side portion of FIG. 1 for the purpose of forming the gate electrode 6 can be individually divided into one or a plurality of island regions predetermined as polycrystalline silicon regions 12 and 15 of the second layer, and can be overlapped on the polycrystalline silicon regions 9 and 14 of the first layer, each of which is divided into the one or plurality of regions. Here, the polycrystalline regions 9 and 14 of the first layer and the polycrystalline regions 12 and 15 of the second layer, each of which is divided into the one or plurality of regions, are divided into desired island regions with predetermined arbitrary sizes.

With regard to the electrostatic discharge protection element 60, in order to form the bidirectional Zener diode, semiconductor regions of the first layer and the second layer are formed of components of mutually different conduction types, and the electrostatic discharge protection element 60 is composed so that contact regions of both of the semiconductor regions can form PN junction surfaces. Specifically, as shown in the center portion of FIG. 1, as the polycrystalline silicon regions 14 of the first layer, the polycrystalline silicon of the semiconductor film deposited for the purpose of forming the hetero semiconductor region 4 is made to have the N+ conduction type, for example, that is the same as that of the semiconductor base, and is divided into a plurality of regions. Inter-region gaps by the divided polycrystalline silicon regions 14 of the first layer are insulated and separated from one another, for example, by an oxidation film deposited for the purpose of forming the gate insulating film 5. Furthermore, the polycrystalline silicon deposited for the purpose of forming the gate electrode 6 is formed as the polycrystalline silicon region 15 of the second layer in a form of being alternately overlapped on the plurality of polycrystalline silicon regions 14 of the first layer while being positionally shifted therefrom so as to bridge the polycrystalline silicon regions 14. The conduction type of the polycrystalline silicon thus deposited is the P+ conduction type different from that of the polycrystalline silicon regions 14 of the first layer. These polycrystalline silicon regions 14 and 15 of the first and second layers are bonded to one another, whereby the PN junction is formed, and the bidirectional Zener diode is formed.

Specifically, in the electrostatic discharge protection element 60 of FIG. 1, two layers which are the first layer including two N+ polycrystalline silicon regions 14 and the second layer including one P+ polycrystalline silicon region 15 are connected to each other so as to overlap at positions alternately shifted from each other and to bridge the polycrystalline silicon regions 14. In such a way, the PN junction surfaces are composed of the respective joint portions, and one bidirectional Zener diode is formed.

Here, as described above, in the bidirectional Zener diode of the electrostatic discharge protection element 60, one of the N+ polycrystalline silicon regions 14 is connected to the source electrode 7, and the other N+ polycrystalline silicon region 14 is connected to an external gate electrode terminal region (a GP region) 11. By such connections, even if the static electricity is applied to the external gate electrode terminal region (the GP region) 11 exposed to the outside, the static electricity is not directly applied to the gate electrode 6 but is discharged to the source electrode 7 through the bidirectional Zener diode of the electrostatic discharge protection element 60.

Moreover, with regard to the protection resistor 70, in order to form a resistor having a desired resistance value for use in protecting the gate electrode, semiconductor regions of the first layer and the second layer are formed of components of the same conduction type, and are brought into contact with each other, whereby a stacked resistor in which a plurality of resistors are serially connected is composed. specifically, as shown in the left-side portion of FIG. 1, as the resistor layers 9 of the first layer, the polycrystalline silicon deposited for the purpose of forming the hetero semiconductor region 4 is made to have the N+ conduction type, for example, that is the same as that of the semiconductor base, and is divided into a plurality of regions. In a similar way to the case of the electrostatic discharge protection element 60, inter-region gaps by the divided resistor layers 9 of the first layer are insulated and separated from one another, for example, by the oxidation film deposited for the purpose of forming the gate insulating film 5. Furthermore, in a similar way to the case of the electrostatic discharge protection element 60, the polycrystalline silicon deposited for the purpose of forming the gate electrode 6 is formed as the resistor layer 12 of the second layer in a form of being alternately overlapped on the plurality of resistor layers 9 of the first layer while being positionally shifted therefrom so as to bridge the resistor layers 9. The conduction type of the polycrystalline silicon thus deposited is the N+ conduction type that is the same as that of the resistor layer 9 of the first layer. These resistor layers 9 and 12 of the first and second layers are serially connected to one another, whereby it is made possible to realize a higher resistance value.

Specifically, in the protection resistor 70 of FIG. 1, two layers which are the first layer including two N+ resistor layers 9 and the second layer including one N+ resistor layer 12 are connected to each other so as to overlap at positions alternately shifted from each other and to bridge the N+ resistor layers 9. In such away, as the stacked resistor, three resistors are serially connected to one another.

Here, as described above, in the protection resistor 70, one of the N+ resistor layers 9 is connected to the external gate electrode terminal region (the GP region) 11, and the other N+ resistor layer 9 is connected to an internal gate electrode (Gin) 10, and thus to the gate electrode 6 of the field effect transistor 50. Here, to the external gate electrode terminal region (the GP region) 11, the other N+ polycrystalline silicon region 14 of the bidirectional Zener diode is also connected.

Note that the internal gate electrode (Gin) 10 is connected to the gate electrode 6 formed of the polycrystalline silicon of the second layer through the gate runner 26 as shown in FIG. 17. By such a connection, even if a part of the static electricity that has not been discharged through the bidirectional Zener diode of the electrostatic discharge protection element 60 enters the gate electrode 6 side in the case where the static electricity is applied to the external gate electrode terminal region (the GP region) 11 exposed to the outside, the static electricity is diffused in the gate electrode 6 rapidly at a sufficiently high speed by the protection resistor 70 of which sheet resistance is sufficiently higher than that of the gate electrode 6, and a high electric field is not applied to the gate insulating film 5, thus making it possible to prevent an occurrence of electrical breakdown of the gate insulating film 5.

Function of Semiconductor Device of this Embodiment

Next, a description will be further made of a function of the semiconductor device 100 shown in FIG. 1.

A basic operation of the heterojunction field effect transistor of this embodiment is substantially similar to those described in Patent Document 1 and Japanese Patent Laid-Open Publication No. 2003-318398 "Silicon Carbide Semiconductor Device". However, the heterojunction field effect transistor of this embodiment does not have a channel region as in a usual power MOSFET, and accordingly, can be a field effect transistor in which the resistance is lower and the loss is small.

Figure 4:
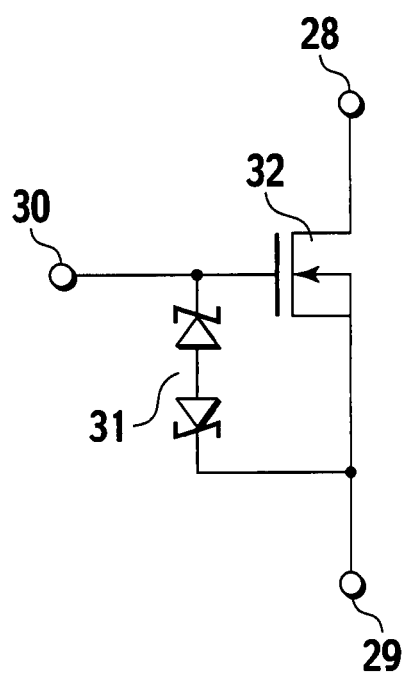
FIG. 4 is a circuit diagram showing an equivalent circuit, expressing a connection state of an electrostatic discharge protection element and the field effect transistor in FIG. 1.
Figure 5:
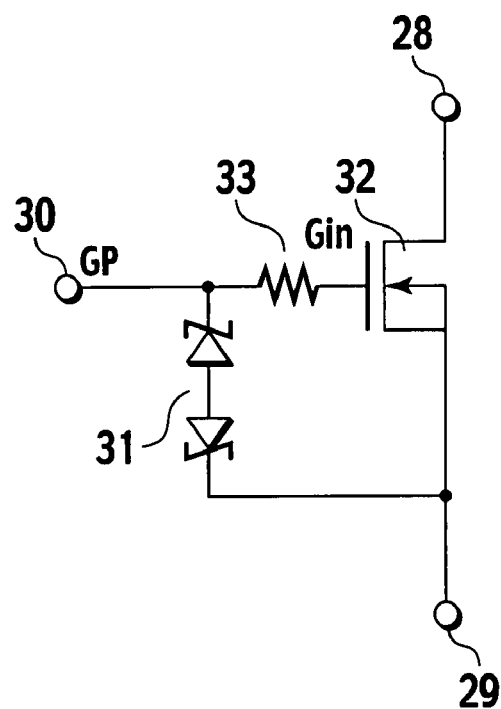
FIG. 5 is a circuit diagram showing an equivalent circuit when a protection resistor of FIG. 1 is further connected to the equivalent circuit of FIG. 4.

First, a description will be made of the function of the heterojunction field effect transistor 100 shown in FIG. 1 by using equivalent circuit diagrams of FIG. 4 and FIG. 5 showing connection relationships among the electrostatic discharge protection element 60 and the protection resistor 70, which are provided as the electrostatic protection passive element of the heterojunction field effect transistor 50, and the field effect transistor 50 in the field effect transistor 100. Here, FIG. 4 is a circuit diagram showing an equivalent circuit expressing a connection state between the electrostatic discharge protection element 60 and field effect transistor 50 of FIG. 1, and FIG. 5 is a circuit diagram showing an equivalent circuit of the case of further connecting the protection resistor 70 of FIG. 1 to the equivalent circuit of FIG. 4.

As shown in the equivalent circuit of FIG. 4, a configuration is adopted, in which a bidirectional Zener diode 31 (the electrostatic discharge protection element 60 composed of the N+ polycrystalline silicon regions 14 of the first layer and the P+ polycrystalline silicon region 15 of the second layer in FIG. 1) is connected as a protection element for discharging the static electricity applied to a gate electrode terminal 30 between a source electrode terminal 29 (the source electrode 7 of FIG. 1) and gate electrode terminal 30 (the external gate electrode terminal region 11 of FIG. 1) of a field effect transistor 32 (the field effect transistor 50 of FIG. 1).

Hence, even if an object charged with the static electricity, such as a human body, contacts the gate terminal 30 exposed to the outside, a potential of the static electricity is not directly applied to a gate electrode of the field effect transistor 32, and the potential can be released to the source electrode terminal 29 side through the bidirectional Zener diode 31. As a result, the gate insulating film 5 of FIG. 1 can be protected from a serious damage even if an abnormally high potential, which would easily cause a breakdown of the gate insulating film 5, might be applied, and a situation where the field effect transistor 32 becomes unoperatable can be prevented.

Moreover, as shown in the structure of the device cross section of FIG. 1, in order to absorb the input voltage to the gate electrode 6, on the field oxide film 8, the protection resistor 70 (the stacked resistor composed of the N+ polycrystalline silicon regions 9 of the first layer and the N+ polycrystalline silicon region 12 of the second layer in FIG. 1) having a larger sheet resistance value than the sheet resistance of the gate electrode 6 is formed for use in protecting the gate electrode 6 of the field effect transistor 100. Both ends of the protection resistor 70 are individually connected to the external gate electrode terminal region (the GP region) 11 and the internal gate electrode terminal region (the Gin region) 10 so that the protection resistor 70 can be connected between the external gate electrode terminal region 11 and the internal gate electrode terminal region 10.

By such a connection of the protection resistor 70, as shown in the equivalent circuit of FIG. 5, one end of a gate protection resistor 33 (the protection resistor 60 of FIG. 1) having a larger sheet resistance value than the sheet resistance of the gate electrode 6 is connected to a side of the bidirectional Zener diode 31, to which the gate electrode terminal 30 (the external gate electrode terminal region (the GP region) 11 of FIG. 1) is connected, and the other end of the gate protection resistor 33 is connected to the gate electrode (the gate electrode 6 through the internal gate electrode terminal region (the Gin region) 10 of FIG. 1) of the field effect transistor 32.

As a result, even if the object charged with the static electricity, such as the human body, is brought into contact with the gate terminal 30 exposed to the outside, the potential of the static electricity is not directly applied to the gate electrode of the field effect transistor 32, and a part of the static electricity that has entered the gate electrode of the field effect transistor 32 is rapidly diffused into the gate electrode, and such an abnormal electric field that causes the electrical breakdown of the gate insulating film 5 can be prevented from being applied to the gate electrode concerned.

Next, a description will be made of a point that the semiconductor device 100 in this embodiment has a more excellent electrostatic protection function than the semiconductor device of the conventional technology, for example, the semiconductor device shown in Patent Document 1.

Figure 18:
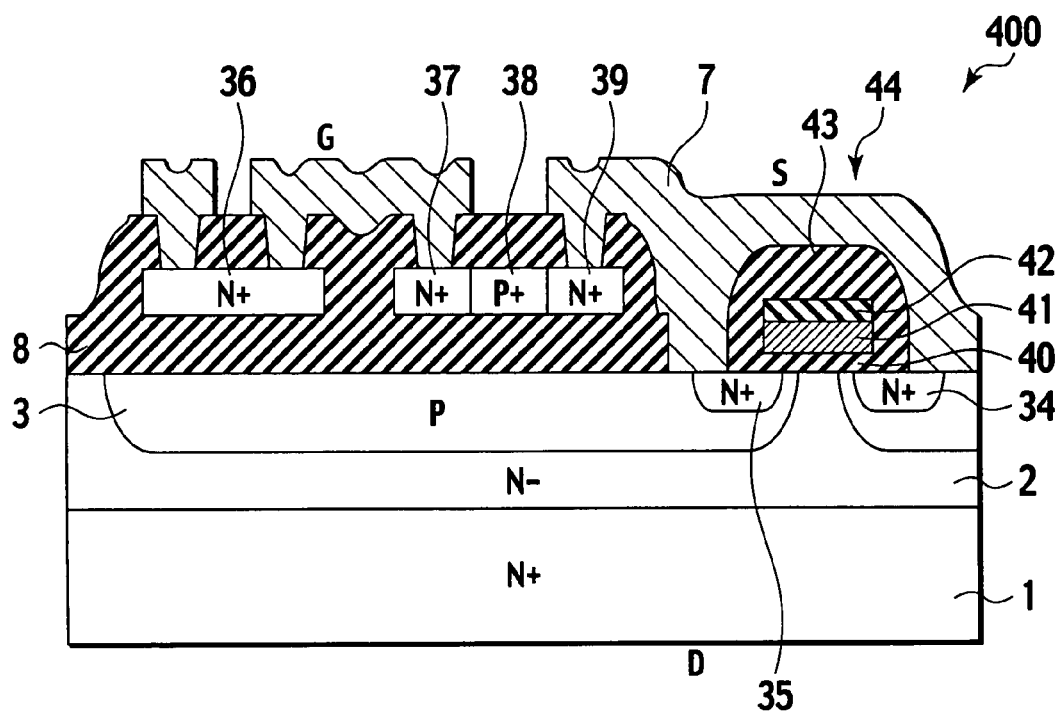
FIG. 18 is a cross-sectional view schematically showing a device cross-sectional structure of a field effect transistor in a conventional semiconductor device.

First, a description will be made of a device structure of the conventional semiconductor device described in Patent Document 1 by using an element cross-sectional view of FIG. 18. FIG. 18 is a cross-sectional view schematically showing a device cross-sectional view of the field effect transistor in the conventional semiconductor device shown in Patent Document 1.

Also in the conventional semiconductor device 400 shown in FIG. 18, in a substantially similar way to the case of the semiconductor device 100 of the present invention in FIG. 1, the field effect transistor is formed on the right-side portion of FIG. 18, and a passive element for the protection from the static electricity is formed on the left-side portion of FIG. 18. However, the passive element in the semiconductor device 400 of FIG. 18 is not formed into a stacked structure composed of two layers as in the case of the present invention, but is composed only of one layer. An electrostatic discharge protection element composed of N+ poly-Si region 37, a P+ poly-Si region 38, and an N+ poly-Si region 39, which form the bidirectional Zener diode, and a resistor 36 composed of an N+ poly-Si region are formed in the same one layer.

A field effect transistor 44 has a substantially similar structure to that in the case of the semiconductor device 100 of the present invention in FIG. 1. However, unlike the heterojunction type in the present invention, the field effect transistor 44 is a MOS transistor. In the field effect transistor 44, N+ source diffusion layers 34 and 35 are formed in the P well regions formed in the N− SiC drain region 2 of the semiconductor base, and a gate electrode 41 and a silicide layer 42 are formed on the N− SiC drain region 2 and at a position close to the N+ source diffusion layers 34 and 35 with a gate oxide film 40 interposed therebetween. Moreover, a source electrode 7 ohmically contacts the N+ source diffusion layers 34 and 35 with an interlayer insulating film 43 interposed therebetween. The interlayer insulating film 43 is formed so as to cover the gate electrode 41 and the silicide layer 42.

Moreover, as the electrostatic discharge protection element in the conventional semiconductor device 400 of FIG. 18, as described above, the bidirectional Zener diode is composed by forming two PN junction surfaces in such a manner that opposite side surfaces of the N+ poly-Si region 37, the P+ poly-Si region 38, and the N+ poly-Si region 39, which are formed in the same one layer in the field oxide film 8, are brought into contact with each other. In a similar way to the case of the semiconductor device 100 of the present invention in FIG. 1, the N+ poly-Si region 37 on one side is connected to an external gate terminal electrode region G, and the N+ poly-Si region 39 on the other side is connected to the source electrode 7.

Moreover, the resistor 36 in the conventional semiconductor device 400 of FIG. 18 is not formed into the stacked structure composed of two layers like the semiconductor device 100 of the present invention in FIG. 1, but is formed of the N+ poly-Si region composed of only the single N+ poly-Si region.

As described above, the structure of the conventional semiconductor device 400 of FIG. 18 is largely different from the structure of the semiconductor device 100 of the first embodiment of the present invention which includes the electrostatic discharge protection element 60 and the protection resistor 70 as structured shown in FIG. 1.

Specifically, in the heterojunction field effect transistor like the semiconductor device 100 of the present invention, which is shown in FIG. 1, as described above, with regard to the electrostatic discharge protection element 60, unlike the configuration in FIG. 18, the junction surfaces of the Zener diode are formed of the contact regions where the N+ polycrystalline silicon regions 14 of the first layer and the P+ polycrystalline silicon region 15 of the second layer are vertically and alternately overlapped with each other so that the P+ polycrystalline silicon region 15 can bridge the N+ polycrystalline silicon regions 14. Therefore, even if the same occupied area as that of the conventional semiconductor device 400 in terms of the plane can be only ensured for the semiconductor device 100 formed similarly on the restricted narrow region around the external gate electrode terminal region (the GP region) 11, it is made possible to obtain sufficiently wide junction areas in comparison with the junction areas as in the conventional semiconductor device 400 in which the N+ poly-Si region 37, the P+ poly-Si region 38, and the N+ poly-Si region 39 are brought into contact with one another by the side surfaces (film thickness portions of the polycrystalline silicon layers) thereof.

Hence, in the electrostatic discharge protection element 60 with the bidirectional Zener diode as in the semiconductor device 100 of the present invention in FIG. 1, the junction area of the PN junction surfaces of the bidirectional Zener diode can be made large. Accordingly, when the static electricity is applied to the external gate electrode terminal region 11 of the field effect transistor 50, the internal resistance of the bidirectional Zener diode after the breakdown thereof can be made sufficiently small. Therefore, an effect is obtained that the tolerance of the semiconductor device 100 for the static electricity can be ensured more largely than the tolerance of the conventional semiconductor device 400 as shown in FIG. 18.

Note that, for members forming the stacked structure of the N+ polycrystalline silicon regions 14 of the first layer and the P+ polycrystalline silicon region 15 of the second layer, as described above, semiconductor films forming the hetero semiconductor region 4 and the gate electrode 6 which are originally required for forming the field effect transistor 50, for example, polycrystalline silicon layers can be directly used. Accordingly, a large increase of the manufacturing steps is not required, and an increase of manufacturing cost can be suppressed.

Moreover, also with regard to the protection resistor 70, even if the occupied area thereof is the same as that of the conventional semiconductor device 400 shown in FIG. 18 in terms of the plane, the stacked structure is adopted for the protection resistor 70, in which the plurality of small regions obtained by dividing the polycrystalline silicon are stacked. Specifically, the stacked structure is adopted, in which the N+ resistor layers 9 of the first layer and the N+ resistor layer 12 of the second layer are serially connected so as to be alternately bridged while having the regions overlapped with each other. Accordingly, in comparison with the conventional semiconductor device 400 as shown in FIG. 18, it is possible to increase a degree of freedom of the resistance value of the protection resistor 70. Then, it is made possible to set the resistance value at a value at which a sufficient tolerance for the static electricity is obtained, and an effect is obtained that the tolerance of the semiconductor device 100 for the static electricity can be further enhanced.

Furthermore, in a similar way to the case of the electrostatic discharge protection element 60, for members forming the stacked structure of the N+ resistor layers 9 of the first layer and the N+ resistor layer 12 of the second layer, semiconductor films forming the hetero semiconductor region 4 and the gate electrode 6 which are originally required for forming the field effect transistor 50, for example, the polycrystalline silicon layers can be directly used. Accordingly, the large increase of the manufacturing steps is not required, and the increase of the manufacturing cost can be suppressed.

Example of Manufacturing Method

Next, a description will be made of a manufacturing method of the semiconductor device 100 according to the first embodiment of the present invention, which is shown in FIG. 1, by using FIG. 6 to FIG. 16. Here, FIG. 6 to FIG. 16 are cross-sectional views showing examples of cross-sectional structures of intermediate products in the respective steps of manufacturing the semiconductor device 100 according to the first embodiment of the present invention. FIG. 6 to FIG. 16 show the examples of the intermediate products manufactured in the first step to the eleventh step, respectively.

Figure 6:
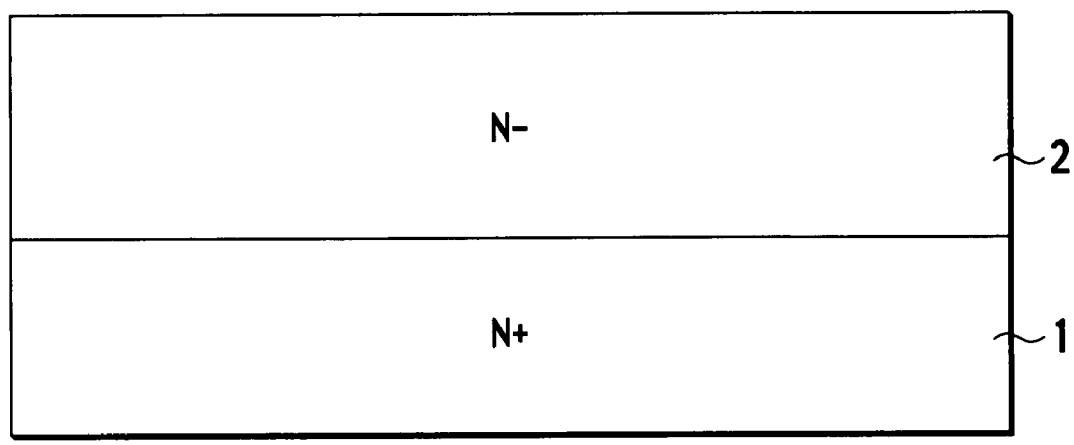
FIG. 6 is a cross-sectional view showing an example of a cross-sectional structure of an intermediate product in a first step of manufacturing the semiconductor device according to the first embodiment of the present invention.

First, as shown in the cross-sectional view in the first step (a semiconductor base forming step) of FIG. 6, the drain region 2 formed of N− SiC is formed on the N+ SiC substrate region 1 by epitaxial growing or the like, and the semiconductor base is fabricated.

Figure 7:
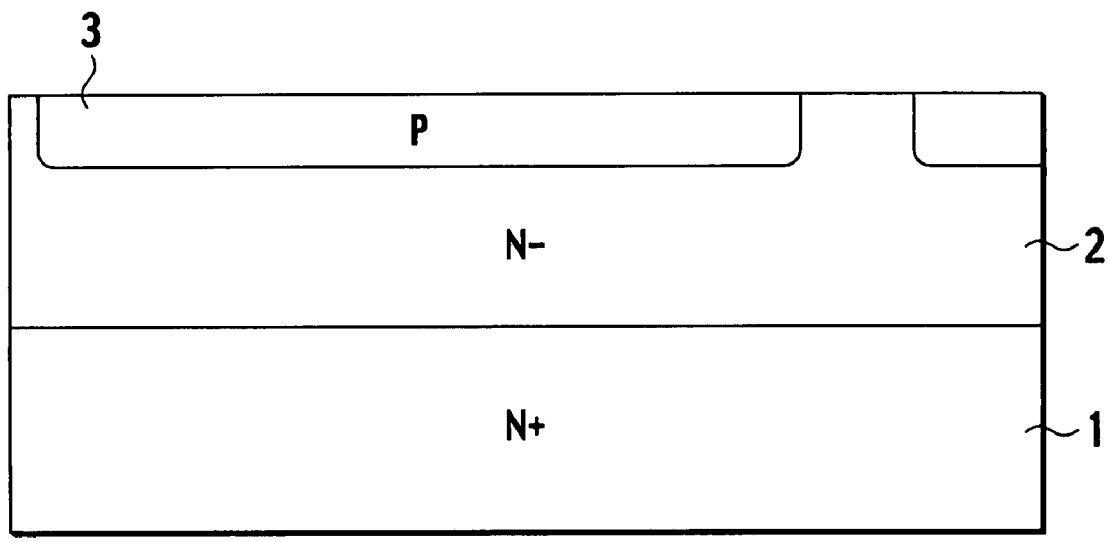
FIG. 7 is a cross-sectional view showing an example of a cross-sectional structure of an intermediate product in a second step of manufacturing the semiconductor device according to the first embodiment of the present invention.

Next, as shown in the cross-sectional view in the second step (a P well region forming step) of FIG. 7, the P well regions 3 are formed on the desired position in the N− SiC drain region 2. In the event of forming the P well regions 3, though not shown, a resist mask is first patterned for forming the P well regions 3 on the desired position, and then P impurities such as Al and B are implanted by ion implantation or the like. Thereafter, a resist pattern is peeled off, and a high-temperature annealing treatment is implemented, thus making it possible to form the P well regions 3 on the desired position.

Figure 8:
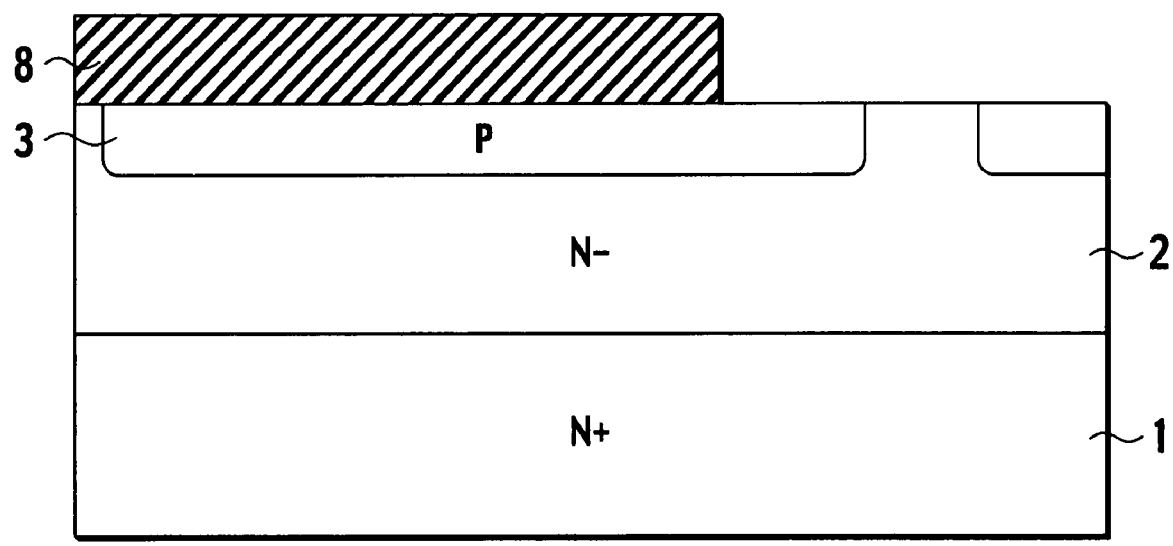
FIG. 8 is a cross-sectional view showing an example of a cross-sectional structure of an intermediate product in a third step of manufacturing the semiconductor device according to the first embodiment of the present invention.

Next, as shown in the cross-sectional view in the third step (a field oxide film forming step: a field insulating film forming step) of FIG. 8, on the desired position (that is, the formed region of the passive element as the electrostatic discharge protection element 60 and the protection resistor 70 which are shown in FIG. 1) of the N− SiC drain region 2, the field oxide film 8 is formed so that the film thickness thereof can be thicker than that of the gate insulating film 5 to be described later. The field oxide film 8 is a field insulating film formed as an insulating film on a predetermined region on the N− SiC drain region 2 so that the film thickness thereof can be thick in order to completely insulate and separate the passive elements, such as the electrostatic discharge protection element and protection resistor which eliminate the static electricity, from the N− SiC drain region 2. For example, it is possible to form the field oxide film 8 in such a manner that a chemical vapor deposition (CVD) oxide film is deposited on the entire surface on the N− SiC drain region 2, followed by etching into a desired pattern.

Figure 9:
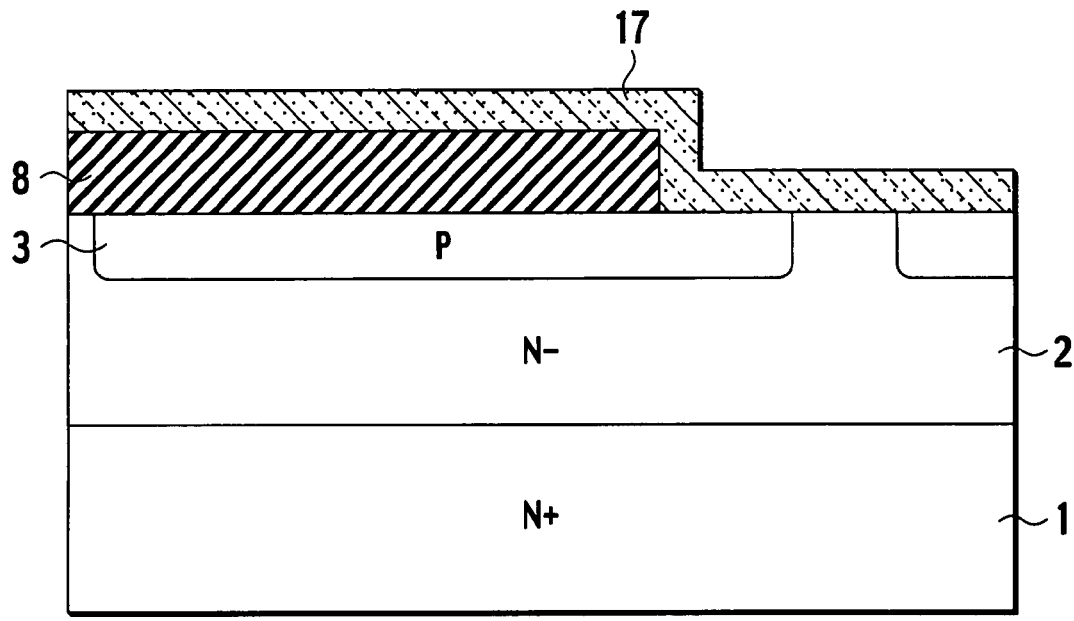
FIG. 9 is a cross-sectional view showing an example of a cross-sectional structure of an intermediate product in a fourth step of manufacturing the semiconductor device according to the first embodiment of the present invention.

Next, as shown in the cross-sectional view in the fourth step (a first-layer polycrystalline silicon layer forming step: a first-layer semiconductor film forming step) of FIG. 9, a semiconductor layer of the first layer, for example, the polycrystalline silicon layer (the poly-Si layer) 17 for forming the hetero semiconductor region 4 is deposited on the field oxide film 8 and the N− SiC drain region 2. Such a first-layer polycrystalline silicon layer (the poly-Si layer) 17 deposited on the N− SiC drain region 2 is a semiconductor material different in band gap from the N− SiC drain region 2. The polycrystalline silicon layer 17 forms the hetero junction with the N− SiC drain region 2, and eventually, forms the hetero semiconductor region. The first-layer polycrystalline silicon layer 17 is simultaneously used as a semiconductor layer for forming the first-layer polycrystalline silicon regions 14 of the electrostatic discharge protection element 60 and the first-layer resistor layers 9 of the protection resistor 70.

Figure 10:
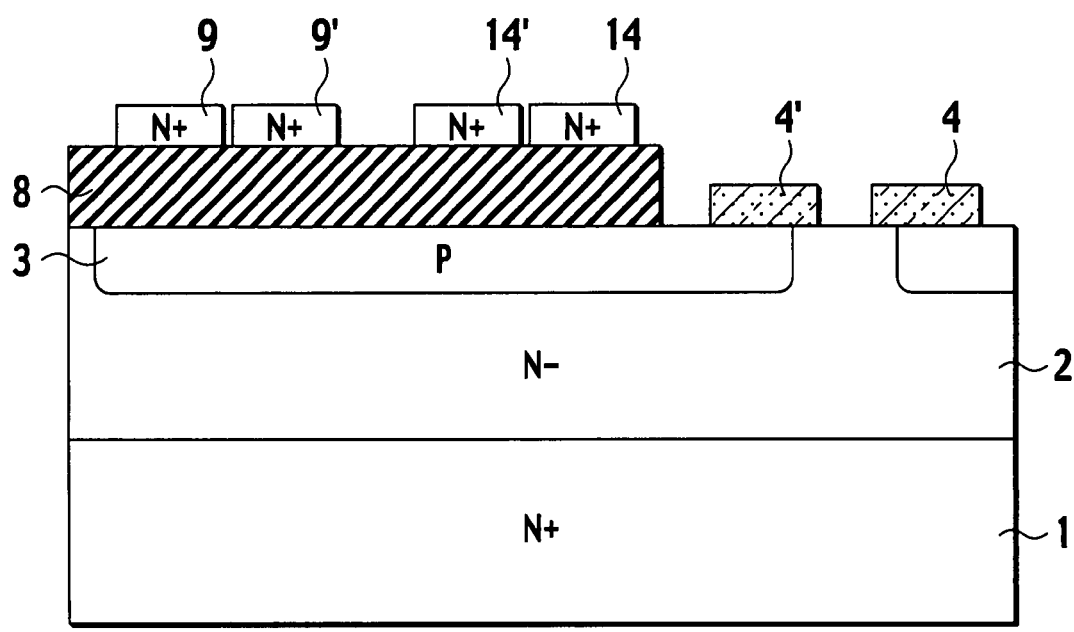
FIG. 10 is a cross-sectional view showing an example of a cross-sectional structure of an intermediate product in a fifth step of manufacturing the semiconductor device according to the first embodiment of the present invention.

Next, as shown in the cross-sectional view in the fifth step (a first-layer polycrystalline silicon region dividing step: a first-layer semiconductor film dividing step) of FIG. 10, the first-layer polycrystalline silicon layer 17 is divided into one or plurality of predetermined regions as the plurality of hetero semiconductor regions 4 and the first-layer semiconductor regions of the passive element. In FIG. 10, the first-layer polycrystalline silicon layer 17 on the N− SiC drain region 2 is divided into two hetero semiconductor regions 4 and 4'. The first-layer polycrystalline silicon layer 17 on the field oxide film 8 is a region where the electrostatic discharge protection element 60 of the bidirectional Zener diode and the protection resistor 70 which are for composing the electrostatic protection passive element are formed, and is divided individually into the first-layer N+ poly-Si regions 14 and 14' and the first-layer N+ resistor layers 9 and 9'.

Note that, though not shown, it is possible to form the first-layer N+ poly-Si regions 14 and 14' and the first-layer N+resistor layers 9 and 9', which become the electrostatic discharge protection element 60 and the protection resistor 70, for example, by means such as the ion implantation in such a manner that impurities of a predetermined conduction type, for example, impurities which become the same conduction type as that of the semiconductor base, for example, the N+ type are introduced thereinto, and thereafter, the resist is patterned and the first-layer polycrystalline silicon layer 17 is etched. As representative examples of impurity species which are made to become the N+ type, arsenic (As) and phosphorus (P) are mentioned.

Figure 11:
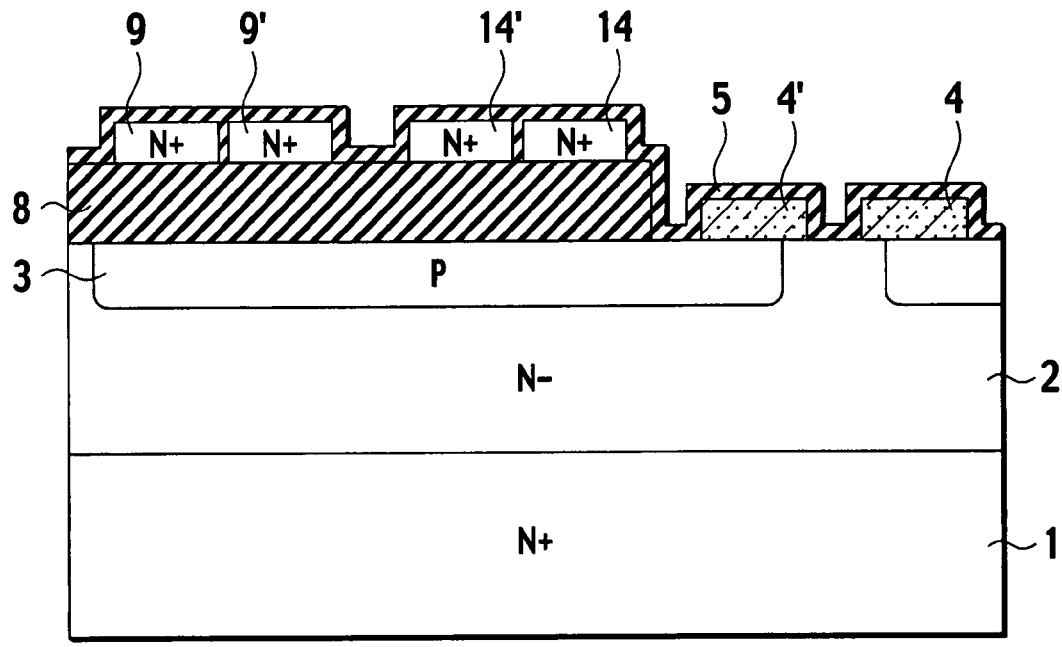
FIG. 11 is a cross-sectional view showing an example of a cross-sectional structure of an intermediate product in a sixth step of manufacturing the semiconductor device according to the first embodiment of the present invention.

Next, as shown in the cross-sectional view in the sixth step (a gate insulating film forming step) of FIG. 11, on the field oxide film 8, the N− SiC drain region 2, the first-layer N+ resistor layers 9 and 9', and the first-layer N+ poly-Si regions 14 and 14', the gate insulating film 5, for example, an oxide film is formed on the entire surface so as to cover the entirety of the above-described regions, which includes the side surfaces of the regions concerned. However, the gate insulating film 5 of the field effect transistor 50 is formed so that the film thickness thereof can be largely thinner than the film thickness of the filed oxide film 8 formed in the third step of FIG. 8.

Figure 12:
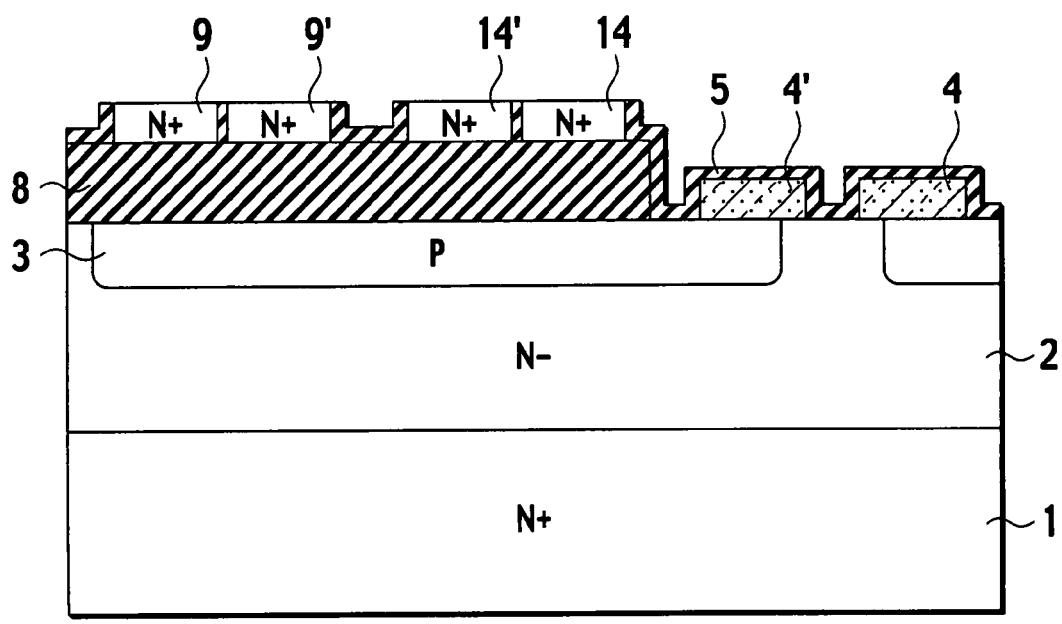
FIG. 12 is a cross-sectional view showing an example of a cross-sectional structure of an intermediate product in a seventh step of manufacturing the semiconductor device according to the first embodiment of the present invention.

Next, as shown in the cross-sectional view in the seventh step (an exposing step of the first-layer N+ resistor layer and the N+ poly-Si region: a first-layer semiconductor region exposing step) of FIG. 12), the gate insulating film 5 formed on the upper surface of the first-layer semiconductor region on the passive element side, that is, the gate insulating film 5 deposited on the first-layer N+ poly-Si regions 14 and 14' and the first-layer N+resistor layers 9 and 9', which become the electrostatic discharge protection element 60 and the protection resistor 70, is removed. Then, the surfaces (the upper surfaces) of the respective N+ polycrystalline silicon regions are exposed. It is possible to implement this step of exposing the surfaces of the first-layer N+ poly-Si regions 14 and 14' and the first-layer N+ resistor layers 9 and 9' by patterning by the resist, etching of the gate insulating film 5, and further, removal of the resist. Note that, by this gate insulating film 5, the first-layer N+ resistor layer 9 and the first-layer N+ resistor layer 9' are also brought into a state of being insulated and separated from each other, and the first-layer N+ poly-Si region 14 and the first-layer N+ poly-Si region 14' are also brought into a state of being insulated and separated from each other.

Figure 13:
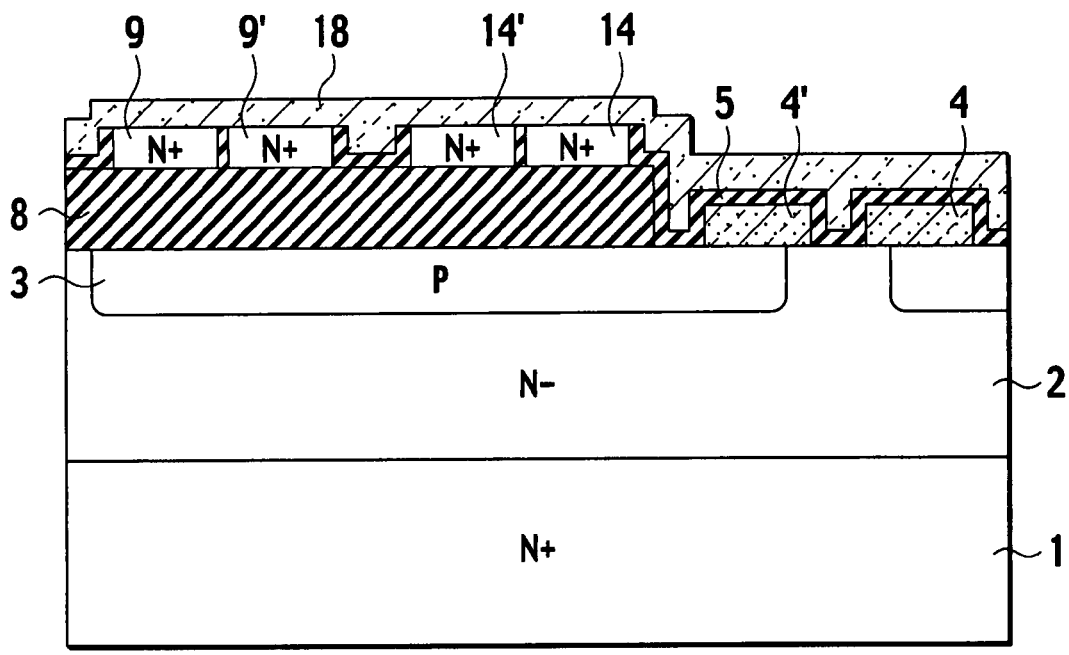
FIG. 13 is a cross-sectional view showing an example of a cross-sectional structure of an intermediate product in an eighth step of manufacturing the semiconductor device according to the first embodiment of the present invention.

Next, as shown in the cross-sectional view in the eighth step (a second-layer polycrystalline silicon layer forming step: a second-layer semiconductor film forming step) of FIG. 13, on the gate insulating film 5, the exposed first-layer N+ poly-Si regions 14 and 14', and the exposed first-layer N+ resistor layers 9 and 9', a second-layer semiconductor layer, for example, the polycrystalline silicon layer 18 for forming the gate electrode 6 is entirely deposited. The second-layer polycrystalline silicon layer 18 is simultaneously used as a semiconductor layer for forming the second-layer polycrystalline silicon region 15 of the electrostatic discharge protection element 60 and the second-layer resistor layer 12 of the protection resistor 70.

Figure 14:
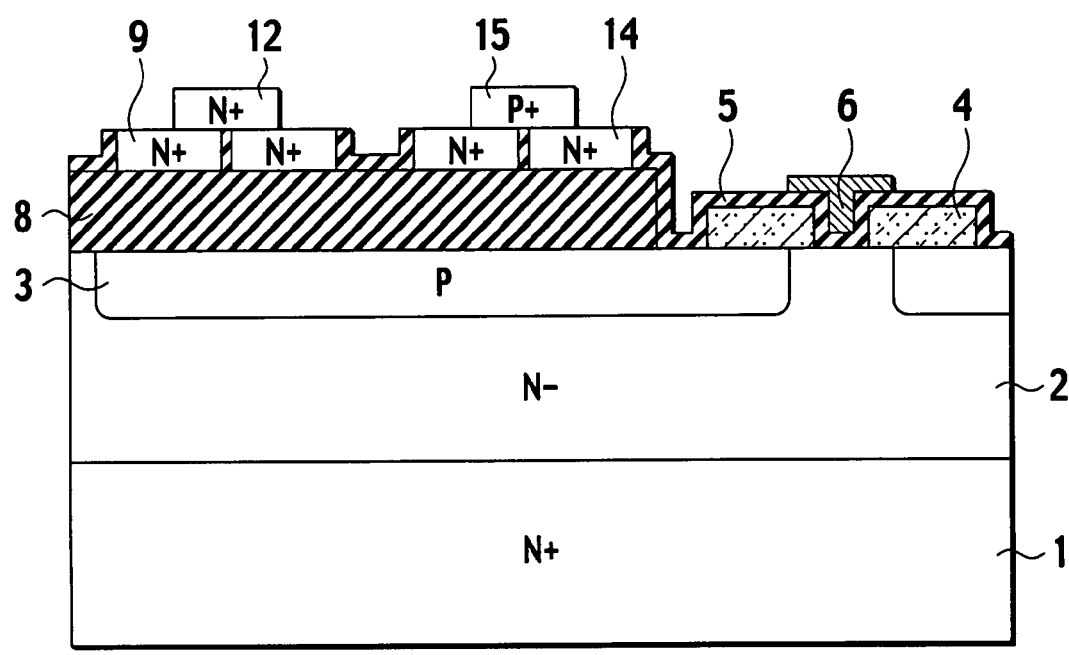
FIG. 14 is a cross-sectional view showing an example of a cross-sectional structure of an intermediate product in a ninth step of manufacturing the semiconductor device according to the first embodiment of the present invention.

Next, as shown in the cross-sectional view in the ninth step (a second-layer polycrystalline silicon layer dividing step: a second-layer semiconductor film dividing step) of FIG. 14, the second-layer polycrystalline silicon layer 18 is patterned so as to be divided into one or a plurality of predetermined regions as the region of the gate electrode 6 and the second-layer semiconductor regions of the passive element. Specifically, in FIG. 14, the second-layer polycrystalline silicon layer 18 is patterned so as to form the gate electrode 6 in the gate electrode forming region that forms the field effect transistor 50, the polycrystalline silicon region, that is, the second-layer P+ poly-Si region 15 overlapped on the first-layer N+ poly-Si regions 14 and 14', which form the electrostatic discharge protection element 60, while being positionally shifted therefrom to bridge the N+ poly-Si regions 14 and 14', and the polycrystalline silicon region, that is, the second-layer N+ resistor layer 12 overlapped on the first-layer N+ resistor layers 9 and 9', which form the protection resistor 70, while being positionally shifted therefrom to bridge the N+resistor layers 9 and 9'.

Note that, though not shown, it is possible to form the second-layer P+ poly-Si region 15 and the second-layer N+ resistor layer 12, which become the electrostatic discharge protection element 60 and the protection resistor 70, for example, by means such as the ion implantation in such a manner that such impurities that become the P+ type (the conduction type different from the conduction type of the first layer, for example, the conduction type different from that of the semiconductor base) and the N+ type (the same conduction type as the conduction type of the first layer, for example, the same conduction type as that of the semiconductor base) are introduced thereinto, respectively, and thereafter, the resist is patterned and the second-layer polycrystalline silicon layer 18 is etched.

As a result, the PN junction surfaces are formed on the contact regions between the first-layer N+ poly-Si regions 14 and 14' and the second-layer P+ poly-Si region 15, which compose the electrostatic discharge protection element 60, and the bidirectional Zener diode is formed. Moreover, the stacked resistor is formed, in which the first-layer N+ resistor layers 9 and 9' and the second-layer N+ resistor layer 12 are serially connected to one another. Note that the conduction type of the gate electrode 6 may be either the N+ type or the P+ type.

Figure 15:
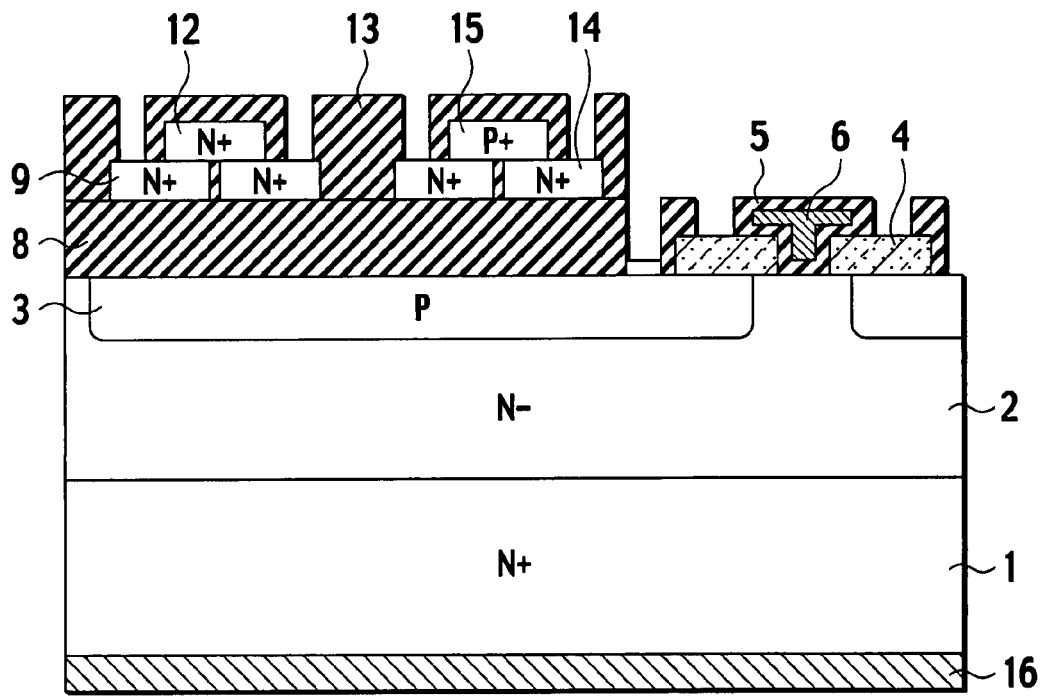
FIG. 15 is a cross-sectional view showing an example of a cross-sectional structure of an intermediate product in a tenth step of manufacturing the semiconductor device according to the first embodiment of the present invention.

Next, as shown in the cross-sectional view in the tenth step (an interlayer insulating film forming step: a drain electrode forming step) of FIG. 15, on the gate electrode 6, the first-layer N+ poly-Si regions 14 and 14', the second-layer P+ poly-Si region 15, the first-layer N+ resistor layers 9 and 9', the second-layer N+ resistor layer 12, and the gate insulating film 5, the interlayer insulating film 13 is entirely formed. Then, the drain electrode 16 is formed on the N+ SiC substrate region 1 side. Thereafter, a contact hole for connecting the source electrode 7 to the N+ poly-Si region 14 is formed on a desired position of the interlayer insulating film 13.

Figure 16:
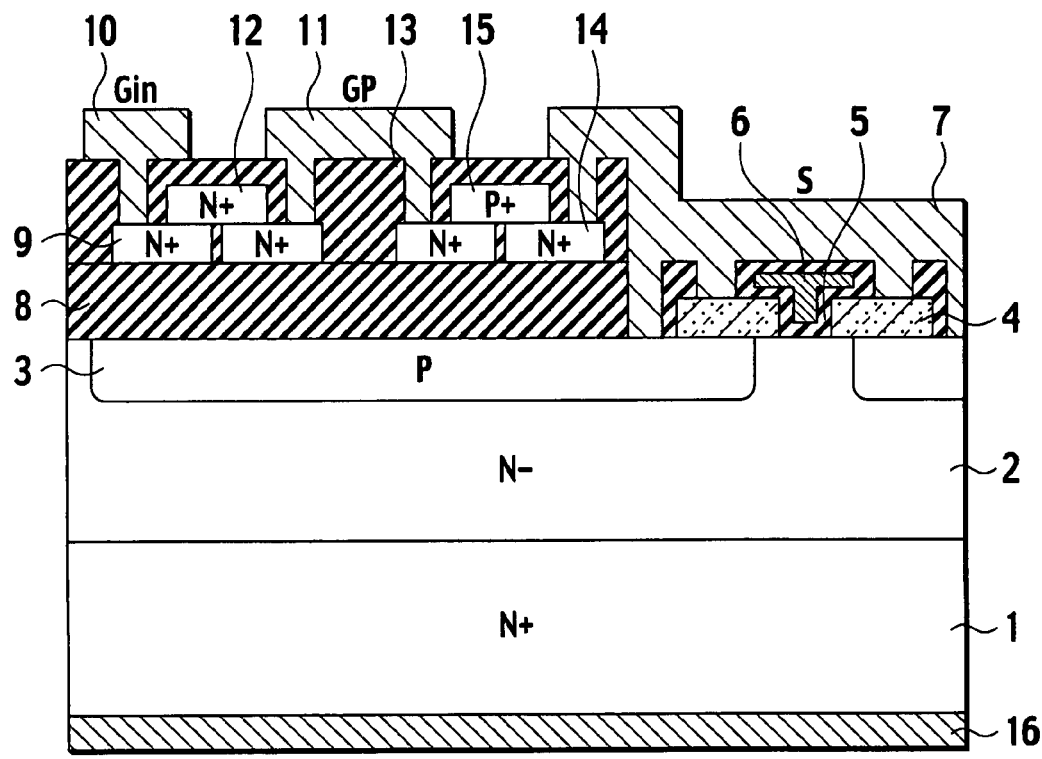
FIG. 16 is a cross-sectional view showing an example of a cross-sectional structure of an intermediate product in an eleventh step of manufacturing the semiconductor device according to the first embodiment of the present invention.

Finally, as shown in the cross-sectional view in the tenth step (source electrode forming step) of FIG. 16, a metal wiring layer is formed over the entire surface of the interlayer insulating film 13 and the contact hole, and the metal wiring layer is etched so as to retain the electrode on a predetermined region, whereby the source electrode 7 is formed. As a result, the source electrode (S) 7 is formed so as to connect the hetero semiconductor regions 4 and 4' which form the field effect transistor 50 and the one-side first-layer N+ poly-Si region 14 that forms the electrostatic discharge protection element 60 to each other. Here, the source electrode 7 becomes connectable to an external circuit through an external source electrode terminal region.

Meanwhile, the external gate electrode terminal region (the GP region) 11 is formed so as to connect the other-side first-layer N+ poly-Si region 14' of the electrostatic discharge protection element 60 and the one-side first-layer N+ resistor layer 9 of the protection resistor 70 to each other, and the gate electrode 6 becomes connectable to the external circuit through the external gate electrode terminal region (the GP region) 11. Moreover, the other-side first-layer N+ resistor layer 9' of the protection resistor 70 is connected to the internal gate electrode terminal region (the Gin region) 10, and though not shown, is connected to the gate electrode 6 via the gate runner (the connection wire as illustrated as the gate runner 26 of FIG. 17). In such a way, the gate electrode 6 becomes connectable to the external circuit through the protection resistor 70.

Through the above-described steps, the semiconductor device 100 of FIG. 1, which is shown in the first embodiment of the present invention, is completed. As described above, in the semiconductor device 100 of FIG. 1, both of the semiconductor films which are the first-layer semiconductor film, for example, the polycrystalline silicon layer 17 that forms the hetero semiconductor region 4 as a constituent element of the field effect transistor 50 and the second-layer semiconductor film, for example, the polycrystalline silicon layer 18 for forming the gate electrode 6 are fully and successfully utilized, and it is possible to form the stacked electrostatic discharge protection element 60 and the protection resistor 70 which are the constituents intrinsic to the present invention as the electrostatic protection passive element for the field effect transistor 50 without increasing the manufacturing steps to a large extent.

As a result, a cost increase owing to the large increase of the manufacturing steps is not brought, and it is possible to realize the field effect transistor having the sufficiently high tolerance for the static electricity, which is as described in this embodiment, while considering the switching speed of the element and the maximum voltage applied to the gate insulating film 5. It is needless to say that it is possible to provide the semiconductor device of the present invention as a semiconductor device capable of greatly contributing to the realization of miniaturization, weight reduction and cost reduction of a power electronics system for use in various purposes including use in a vehicle.

Second Embodiment

Next, a description will be made of a device structure of a second embodiment of the semiconductor device according to the present invention.

Configuration Example

Figure 2:
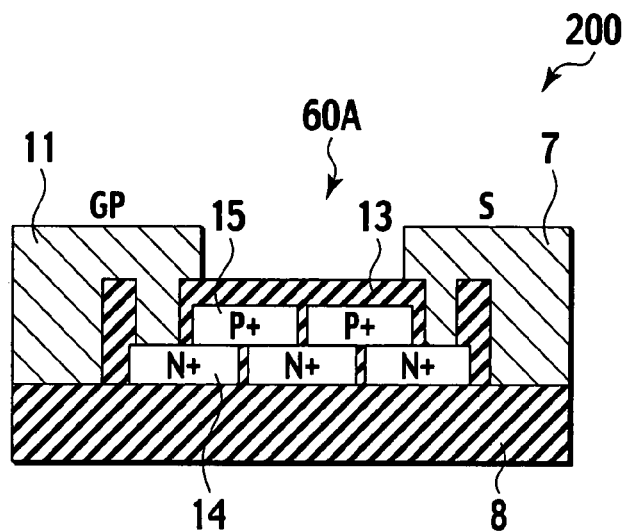
FIG. 2 is a cross-sectional view schematically showing a structure of a device cross section of a field effect transistor in a second embodiment of the semiconductor device according to the present invention.

FIG. 2 is a cross-sectional view schematically showing a structure of a device cross section of a field effect transistor in the second embodiment of the semiconductor device according to the present invention. A basic entire configuration of the semiconductor device 200 of FIG. 2 is substantially similar to that of the semiconductor device 100 of FIG. 1, which is shown in the first embodiment, and a description will be made below only of portions different from those of the semiconductor device 100 of FIG. 1.

Note that the semiconductor device 200 of FIG. 2 is one in which only the region on the field oxide film 8, where an electrostatic discharge protection element 60A is present, is extracted, and the regions of the field effect transistor 50 and protection resistor 70 of FIG. 1 are similar to those of the semiconductor device 100 of FIG. 1.

In comparison with the electrostatic discharge protection element 60 in the semiconductor device 100 of FIG. 1, in the electrostatic discharge protection element 60A in the semiconductor device 200 of FIG. 2, the polycrystalline silicon layer 17 of the first layer is isolated into three regions, and the three regions are formed as three N+ poly-Si regions 14 of the first layer. Moreover, the polycrystalline silicon layer 18 of the second layer is isolated and formed into two P+ poly-Si regions 15 of the second layer. Then, the three N+ poly-Si regions 14 of the first layer and the two P+ poly-Si regions 15 of the second layer form regions arranged at positions shifted from one another and vertically overlapped with each other so that the P+ poly-Si regions 15 can bridge the N+ poly-Si regions 14. In such a way, totally four Zener diodes are serially connected.

With such a configuration, a tolerance obtained by adding up every two tolerances of the Zener diodes composed of the N+ poly crystal silicon regions 14 of the first layer and the P+ polycrystalline silicon regions 15 of the second layer can be defined as a one-side tolerance of the bidirectional Zener diode, and the tolerance of the bidirectional Zener diode for the static electricity can be increased.

Note that, though this embodiment shows the case of forming four Zener diodes, it is possible to arbitrarily determine the number of Zener diodes in such a manner that the polycrystalline silicon layer 17 of the first layer and the polycrystalline silicon layer 18 of the second layer are divided into arbitrary numbers by patterning. In such a way, the following effect intrinsic to the present invention can also be exerted. The effect is that it is possible to increase a degree of freedom in setting the tolerance by dividing the above-described regions into larger numbers of regions. Moreover, it is also possible to compose the electrostatic discharge protection element 60A as a stacked bidirectional Zener diode composed of three or more layers without limiting the number of layers only to two depending on the case.

Third Embodiment

Next, a description will be made of a device structure of a third embodiment of the semiconductor device according to the present invention.

Configuration Example

Figure 3:
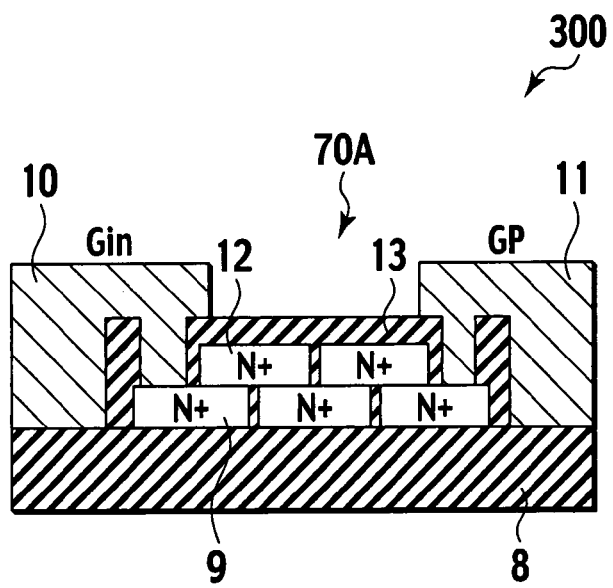
FIG. 3 is a cross-sectional view schematically showing a structure of a device cross section of a field effect transistor in a third embodiment of the semiconductor device according to the present invention.

FIG. 3 is a cross-sectional view schematically showing a structure of a device cross section of a field effect transistor in the third embodiment of the semiconductor device according to the present invention. A basic entire configuration of the semiconductor device 300 of FIG. 3 is substantially similar to the semiconductor device 100 of FIG. 1, which is shown in the first embodiment, and a description will be made below only of portions different from those of the semiconductor device 100 of FIG. 1.

Note that the semiconductor device 300 of FIG. 3 is one in which only the region on the field oxide film 8, where a protection resistor 70A is present, is extracted, and the regions of the field effect transistor 50 and electrostatic discharge protection element 60 of FIG. 1 are similar to those of the semiconductor device 100 of FIG. 1.

In comparison with the protection resistor 70 in the semiconductor device 100 of FIG. 1, in the protection resistor 70A in the semiconductor device 300 of FIG. 3, the polycrystalline silicon layer 17 of the first layer is isolated into three regions, and the three regions are formed as three N+ resistor layers 9 of the first layer. Moreover, the polycrystalline silicon layer 18 of the second layer is isolated and formed into two N+ resistor layers 12 of the second layer. Then, the three N+ resistor layers 9 of the first layer and the two N+ resistor layers 12 of the second layer form regions arranged at positions shifted from one another and vertically overlapped with each other so that the N+ resistor layers 12 can bridge the N+ resistor layers 9. In such a way, these N+ resistor layers are serially connected.

With such a configuration, the number of serially connected N+ resistor layers, which are the N+ resistor layers 9 of the first layer and the N+ resistor layers 12 of the second layer, is increased, thus making it possible to increase the sheet resistance value thereof to a desired arbitrary magnitude in comparison with the resistance value of the sheet resistance in the gate electrode 6.

Moreover, it is possible to arbitrary determine the number of protection resistors in such a manner that the polycrystalline silicon layer 17 of the first layer and the polycrystalline silicon layer 18 of the second layer are divided into arbitrary numbers by patterning. In such a way, the following effect intrinsic to the present invention can also be exerted. The effect is that it is possible to increase the degree of freedom in setting the resistance value by dividing the above-described regions into larger numbers of regions. Moreover, it is also possible to compose the protection resistor 70A as a stacked protection resistor composed of three or more layers without limiting the number of layers only to two depending on the case.

Moreover, it is also possible to combine the protection resistor 70A with the electrostatic discharge protection element 60A as the second embodiment, which is shown in FIG. 2. In this case, it is possible to further enhance the tolerance for the static electricity.

Other Embodiment

In the respective embodiments described above, the description has been made of, as an example, the case where the conduction type of the semiconductor base composed of the N+ SiC substrate region 1 and the N– SiC drain region 2 is set at the N type. However, in the present invention, the conduction type of the semiconductor base may be the P type. In this case, the following configuration just needs to be adopted. Specifically, the conduction type of the polycrystalline silicon regions 14 and 14' of the first layer, which form the electrostatic discharge protection elements 60 and 60A, is set at, for example, the P+ type that is the same as the conduction type of the semiconductor base, and the conduction type of the polycrystalline silicon region 15 of the second layer is set at the N+ type different from that of the polycrystalline silicon regions 14 and 14' of the first layer. Meanwhile, the conduction type of both of the resistor layers 9 and 9' of the first layer and the resistor layer 12 of the second layer, which form the protection resistors 70 and 70A, is set at, for example, the P+ type that is the same as the conduction type of the semiconductor base.

Note that, as shown in the second embodiment and the third embodiment, when the plurality of semiconductor regions of the first layer and the plurality of semiconductor regions of the second layer are provided as the electrostatic discharge protection element 60A and the protection resistor 70A, which compose the electrostatic protection passive element, it is also possible to form the semiconductor regions of the second layer by the number larger than the number of semiconductor regions of the first layer unlike the second embodiment and the third embodiment. In such a case, a configuration just needs to be adopted, in which the connection is made not from the both-end semiconductor regions of the first layer but from the semiconductor regions located on both ends of the second layer to the external gate electrode terminal region (the GP region) and the source electrode terminal, or to the internal gate electrode region (the Gin region).

Moreover, the material of the polycrystalline silicon regions 14 and 14', the resistor layers 9 and 9' of the first layer, the polycrystalline silicon region 15 of the second layer, and the resistor layer 12 of the second layer is not limited to the polycrystalline silicon. As will be described later, these regions and layers may be individually composed of an arbitrary material as long as the material is the same as the semiconductor material that composes the hetero semiconductor regions 4 and 4' and the semiconductor material that forms the gate electrode 6, and just need to be individually composed as the one or plurality of semiconductor regions of the first layer and the one or plurality of semiconductor regions of the second layer.

Furthermore, in the respective embodiments described above, the description has been made of the case where both of the electrostatic discharge protection element 60 or 60A and the protection resistor 70 or 70A are provided; however, depending on the case a configuration may be adopted, in which only either one, for example, the electrostatic discharge protection element 60 is provided.

Furthermore, the material that composes the semiconductor base is not limited to silicon carbide (SiC), and the semiconductor base may be composed of gallium nitride and diamond. Moreover, the material that composes the hetero semiconductor regions 4 and 4' is not limited to polycrystalline silicon and may be either monocrystalline silicon or amorphous silicon, and the material may also be either monocrystalline silicon germanium, polycrystalline silicon germanium, or amorphous silicon germanium, as long as the material forms the hetero junction with the semiconductor base.

Description has been made of the embodiments to which the invention created by the inventors of the present invention is applied. However, the present invention is not limited to the descriptions and the drawings, which form a part of the disclosure of the present invention according to these embodiments. Specifically, all of other embodiments, examples, operational techniques and the like, which are made by those skilled in the art based on these embodiments, are naturally incorporated in the scope of the present invention. The above is additionally described at the end of this specification.

The entire content of Japanese Patent Application No. TOKUGAN 2006-125422 with a filing date of Apr. 28, 2006 is hereby incorporated by reference.

What is claimed is:

1. A semiconductor device manufacturing method of manufacturing a semiconductor device having a semiconductor base, a hetero semiconductor region brought into contact with a first main surface of the semiconductor base and formed of a semiconductor material different in band gap from the semiconductor base, the hetero semiconductor region having an opening portion extending to a surface of the semiconductor base, a gate electrode formed with a gate insulating film provided in the opening portion, a source electrode connected to the hetero semiconductor region, and a drain electrode ohmically connected to the semiconductor base, the semiconductor device including an electrostatic protection passive element formed on the semiconductor base with a field insulating film interposed therebetween, the method comprising:
a field insulating film forming step of forming the field insulating film interposed between the passive element and the semiconductor base so that a film thickness of the field insulating film can be thicker than a film thickness of the gate insulating film;

a first-layer semiconductor film forming step of, in an event of forming a layer of the hetero semiconductor region, forming both semiconductor layers of the hetero semiconductor region and a first-layer semiconductor region of the passive element on the semiconductor base and the field insulating film, respectively, by using the same first-layer semiconductor film; and a first-layer semiconductor film dividing step of dividing the formed first-layer semiconductor film into a plurality of predetermined regions, which are the hetero semiconductor region and the one or more divided first-layer semiconductor regions of the passive element, wherein impurities of a predetermined conduction type are introduced into the one or more divided first-layer semiconductor regions formed by dividing the first-layer semiconductor film in the first-layer semiconductor film dividing step.

2. The semiconductor device manufacturing method according to claim 1, further comprising:

a gate insulating film forming step of forming the gate insulating film on upper and side surfaces of the hetero semiconductor region formed by the division by the first-layer semiconductor film dividing step and on upper and side surfaces of the one or more divided first-layer semiconductor regions formed by the division by the first-layer semiconductor film dividing step; and a first-layer semiconductor region exposing step of removing the gate insulating film formed on the upper surfaces of the one or more divided first-layer semiconductor regions, and exposing the upper surfaces of the one or more divided first-layer semiconductor regions.

3. The semiconductor device manufacturing method according to claim 2, further comprising:

a second-layer semiconductor film forming step of, in an event of forming a layer of the gate electrode, forming both semiconductor layers of the gate electrode and a second-layer semiconductor region of the passive element on an upper surface of the gate insulating film and the upper surfaces of the exposed first-layer semiconductor regions, respectively, by using a same second-layer insulating film; and a second-layer semiconductor film dividing step of dividing the formed second-layer semiconductor film into a plurality of predetermined regions, which are the gate electrode and the one or more divided second-layer semiconductor regions of the passive element, in which contact regions are formed, where the one or more divided second-layer semiconductor regions formed by dividing the second-layer semiconductor film are vertically overlapped and brought into contact with the respective first-layer semiconductor regions.

4. The semiconductor device manufacturing method according to claim 3, wherein impurities of a different conduction type from the conduction type of the first-layer semiconductor region overlapped with the one or more divided second-layer semiconductor regions formed by the division by the second-layer semiconductor film dividing step are introduced into the one or more divided second-layer semiconductor regions, and the contact regions are formed into PN junction surfaces.

5. The semiconductor device manufacturing method according to claim 4, wherein impurities of a same conduction type as a conduction type of the semiconductor base are introduced into the first-layer semiconductor regions, and impurities of a conduction type different from the conduction type of the semiconductor base are introduced into the second-layer semiconductor regions.

6. The semiconductor device manufacturing method according to claim 4, wherein, in an event of dividing the second-layer semiconductor film into the one or more second-layer semiconductor regions by the second-layer semiconductor film dividing step, the second-layer semiconductor film is divided so that the one or more divided second-layer semiconductor regions and the one or more divided first-layer semiconductor regions can be overlapped so as to bridge each other while being positionally shifted from each other, and can be brought into vertical contact with each other by the upper and lower surfaces thereof in the contact regions, and the one or more divided second-layer semiconductor regions and the one or more divided first-layer semiconductor regions are connected to each other while the PN junction surfaces are being directed alternately reversely, and are thereby formed into a mode in which one or more Zener diodes are serially connected.

7. The semiconductor device manufacturing method according to claim 6, wherein a one-end semiconductor region of the one or more divided first-layer semiconductor regions or second-layer semiconductor regions, both of which are overlapped so as to bridge each other, is connected to an external gate electrode terminal to which the gate electrode is connected, and the other-end semiconductor region is connected to the source electrode, whereby the one or more divided first-layer semiconductor regions and the second-layer semiconductor regions are formed as an electrostatic discharge protection element that discharges, through the source electrode, static electricity applied to the external gate electrode terminal.

8. The semiconductor device manufacturing method according to claim 7, wherein both of the electrostatic discharge protection element and the protection resistor are provided.

9. The semiconductor device manufacturing method according to claim 3, wherein impurities of a same conduction type as the conduction type of the first-layer semiconductor region overlapped with the one or more divided second-layer semiconductor regions formed by the division by the second-layer semiconductor film dividing step are introduced into the one or more divided second-layer semiconductor regions, and the one or more divided second-layer semiconductor regions and the first-layer semiconductor regions are formed as a stacked resistor.

10. The semiconductor device manufacturing method according to claim 9, wherein impurities of a same conduction type as a conduction type of the semiconductor base are introduced into both of the first-layer semiconductor regions and the second-layer semiconductor regions.

11. The semiconductor device manufacturing method according to claim 9, wherein, in an event of dividing the second-layer semiconductor film into the one or more second-layer semiconductor regions by the second-layer semiconductor film dividing step, the second-layer semiconductor film is divided so that the one or more divided second-layer semiconductor regions and the one or more divided first-layer semiconductor regions can be overlapped so as to bridge each other while being positionally shifted from each other, and can be brought into vertical contact with each other by the upper and lower surfaces thereof in the contact regions, and the one or more divided second-layer semiconductor regions and the one or more divided first-layer semiconductor regions are formed into a mode in which one or more stacked resistors are serially connected.

12. The semiconductor device manufacturing method according to claim 11, wherein a one-end semiconductor region of the one or more divided first-layer semiconductor regions or second-layer semiconductor regions, both of which are overlapped so as to bridge each other, is connected to an external gate electrode terminal to which the gate electrode is connected, and the other-end semiconductor region is connected to the gate electrode, whereby the one or more divided first-layer semiconductor regions and second-layer semiconductor regions are formed as a protection resistor for protecting the gate electrode.

13. The semiconductor device manufacturing method according to claim 1, wherein any of silicon carbide, gallium nitride, and diamond is used as a semiconductor material of the semiconductor base.

14. The semiconductor device manufacturing method according to claim 1, wherein any of monocrystalline silicon, polycrystalline silicon, and amorphous silicon is used as a semiconductor material of the hetero semiconductor region.

15. The semiconductor device manufacturing method according to claim 1, wherein any of monocrystalline silicon germanium, polycrystalline silicon germanium, and amorphous silicon germanium is used as the semiconductor material of the hetero semiconductor region.

16. A semiconductor device including a semiconductor base, a hetero semiconductor region brought into contact with a first main surface of the semiconductor base and formed of a semiconductor material different in band gap from the semiconductor base, the hetero semiconductor region having an opening portion extending to a surface of the semiconductor base, a gate electrode formed with a gate insulating film provided in the opening portion, a source electrode connected to the hetero semiconductor region, and a drain electrode connected to the semiconductor base, the semiconductor device comprising:
an electrostatic protection passive element formed on the semiconductor base with a field insulating film interposed therebetween,
wherein the passive element is composed of a stacked semiconductor region including one or more divided semiconductor regions of a first layer, one or more divided semiconductor regions of a second layer, and contact regions where the semiconductor regions of the first layer and the semiconductor regions of the second layer are vertically overlapped and brought into contact with each other.

17. The semiconductor device according to claim 16, wherein, in the same layer, the semiconductor regions of the first layer and the semiconductor regions of the second layer are each divided into one or more predetermined and desired island regions, and the divided island regions are electrically insulated from each other.

18. The semiconductor device according to claim 16, wherein a film thickness of the field insulating film interposed between the passive element and the semiconductor base is thicker than a film thickness of the gate insulating film.

19. The semiconductor device according to claim 16, wherein the semiconductor regions of the first layer and the semiconductor regions of the second layer are formed of materials of conduction types different from each other, and the contact regions form PN junction surfaces.

20. The semiconductor device according to claim 19, wherein the conduction type of the semiconductor regions of the first layer is same as a conduction type of the semiconductor base, and the conduction type of the semiconductor regions of the second layer is a different conduction type from the conduction type of the semiconductor base.

21. The semiconductor device according to claim 19, wherein the one or more divided semiconductor regions of the first layer and the one or more divided semiconductor regions of the second layer are arranged to be positionally shifted from each other, are brought into contact with each other in the contact regions while being vertically overlapped with each other so as to bridge each other, are thereby connected to each other while the PN junction surfaces are being directed alternately reversely, and are formed as one or more bidirectional Zener diodes.

22. The semiconductor device according to claim 21, wherein the bidirectional Zener diodes are connected between an external gate electrode terminal to which the gate electrode is connected and the source electrode, and compose an electrostatic discharge protection element that discharges, through the source electrode, static electricity applied to the external gate electrode terminal.

23. The semiconductor device according to claim 22, wherein both of the electrostatic discharge protection element and the protection resistor are provided.

24. The semiconductor device according to claim 16, wherein the one or more divided semiconductor regions of the first layer and semiconductor regions of the second layer are formed of materials of a same conduction type, and form a stacked resistor in which both of the semiconductor regions contact each other in the contact regions.

25. The semiconductor device according to claim 24, wherein the conduction types of both of the semiconductor regions of the first layer and the semiconductor regions of the second layer are same as a conduction type of the semiconductor base.

26. The semiconductor device according to claim 24, wherein the one or more divided semiconductor regions of the first layer and semiconductor regions of the second layer are arranged while being positionally shifted from each other, are brought into contact with each other in the contact regions while being vertically overlapped with each other so as to bridge each other, are thereby formed as a resistor in which the semiconductor regions of the first layer and the semiconductor regions of the second layer are serially connected alternately.

27. The semiconductor device according to claim 26, wherein the resistor is connected between an external gate electrode terminal to which the gate electrode is connected and the gate electrode, and composes a protection resistor for protecting the gate electrode.

28. The semiconductor device according to claim 16, wherein the semiconductor material that forms the semiconductor regions of the first layer is made of a same material as the material that forms the hetero semiconductor region.

29. The semiconductor device according to claim 16, wherein the semiconductor material that forms the semiconductor regions of the second layer is made of a same material as the material that forms the gate electrode.

30. The semiconductor device according to claim 27, wherein both of the electrostatic discharge protection element and the protection resistor are provided.

31. The semiconductor device according to claim 16, wherein the semiconductor material of the semiconductor base is made of any of silicon carbide, gallium nitride, and diamond.

32. The semiconductor device according to claim 16, wherein the semiconductor material of the hetero semiconductor region is made of any of monocrystalline silicon, polycrystalline silicon, and amorphous silicon.

33. The semiconductor device according to claim 16, wherein the semiconductor material of the hetero semiconductor region is made of any of monocrystalline silicon germanium, polycrystalline silicon germanium, and amorphous silicon germanium.

* * * * *